United States Patent
Han

[11] Patent Number: 6,081,564
[45] Date of Patent: Jun. 27, 2000

[54] APPARATUS AND METHODS FOR TRACKING POWER LEVEL OF RECEIVED SIGNAL IN CODE DIVISION MULTIPLE ACCESS COMMUNICATION SYSTEM

[75] Inventor: Deog-Su Han, Seongnam, Rep. of Korea

[73] Assignee: Samsung Electronics Co., Ltd., Rep. of Korea

[21] Appl. No.: 09/000,675

[22] Filed: Dec. 30, 1997

[30] Foreign Application Priority Data

Jan. 20, 1997 [KR] Rep. of Korea .......................... 97/1457

[51] Int. Cl.[7] .............................. H04L 27/08; H04B 1/06; H04B 7/216
[52] U.S. Cl. .................. 375/345; 455/245.1; 455/250.1; 455/136; 455/138; 370/320; 370/335; 370/342; 370/441; 370/479
[58] Field of Search ......................... 375/345; 455/245.1, 455/250.1, 136, 138; 370/320, 335, 342, 441, 479

[56] References Cited

U.S. PATENT DOCUMENTS

| | | | |
|---|---|---|---|
| 4,546,326 | 10/1985 | Van Uffelen et al. | 330/129 |
| 5,050,192 | 9/1991 | Nawata | 375/345 |
| 5,179,353 | 1/1993 | Miyake | 330/129 |
| 5,697,081 | 12/1997 | Lyall, Jr. et al. | 455/249.1 |
| 6,009,307 | 12/1999 | Granata et al. | 455/13.3 |

*Primary Examiner*—Stephen Chin
*Assistant Examiner*—Michael W. Maddox
*Attorney, Agent, or Firm*—Dilworth & Barrese

[57] ABSTRACT

An apparatus and methods for tracking a power level of a signal received at a base station of a code division multiple access (CDMA) digital cellular communication system. The apparatus comprises a storage unit for storing a first table comprising automatic gain control voltages corresponding to a series of received signal levels and a second table comprising variable attenuation control voltages corresponding to the automatic gain control voltages. A method for tracking the power level of the signal received at the base station includes the steps of collecting the automatic gain control voltage and variable attenuation control voltage of a currently received signal, tracking an input level of the received signal corresponding to the automatic gain control voltage of the received signal from the first table, tracking the automatic gain control voltage corresponding to the variable attenuation control voltage of the received signal from the second table, calculating the difference between input levels from the first table by using the tracked automatic gain control voltage, and calculating the power level of the received signal by subtracting the difference between input levels from the tracked input level.

3 Claims, 8 Drawing Sheets

FIG. 6A

| ATTENUATION | VARIABLE ATTENUATION CONTROL VOLTAGE | ATTENUATION | VARIABLE ATTENUATION CONTROL VOLTAGE | ATTENUATION | VARIABLE ATTENUATION CONTROL VOLTAGE | ATTENUATION | VARIABLE ATTENUATION CONTROL VOLTAGE | ATTENUATION | VARIABLE ATTENUATION CONTROL VOLTAGE |
|---|---|---|---|---|---|---|---|---|---|
| 0.0 | 4095 | 15.0 | 2505 | 30.0 | 1909 | 45.0 | 1305 | 60.0 | 915 |
| 0.5 | 3665 | 15.5 | 2495 | 30.5 | 1885 | 45.5 | 1285 | 60.5 | 905 |
| 1.0 | 3485 | 16.0 | 2485 | 31.0 | 1870 | 46.0 | 1275 | 61.0 | 896 |
| 1.5 | 3305 | 16.5 | 2475 | 31.5 | 1855 | 46.5 | 1255 | 61.5 | 887 |
| 2.0 | 3125 | 17.0 | 2445 | 32.0 | 1825 | 47.0 | 1240 | 62.0 | 878 |
| 2.5 | 3025 | 17.5 | 2425 | 32.5 | 1795 | 47.5 | 1225 | 62.5 | 869 |
| 3.0 | 2975 | 18.0 | 2405 | 33.0 | 1775 | 48.0 | 1195 | 63.0 | 860 |
| 3.5 | 2955 | 18.5 | 2385 | 33.5 | 1760 | 48.5 | 1190 | 63.5 | 851 |
| 4.0 | 2935 | 19.0 | 2365 | 34.0 | 1745 | 49.0 | 1185 | 64.0 | 842 |
| 4.5 | 2905 | 19.5 | 2352 | 34.5 | 1715 | 49.5 | 1165 | 64.5 | 833 |
| 5.0 | 2875 | 20.0 | 2339 | 35.0 | 1695 | 50.0 | 1155 | 65.0 | 824 |
| 5.5 | 2845 | 20.5 | 2325 | 35.5 | 1675 | 50.5 | 1135 | 65.5 | 815 |
| 6.0 | 2825 | 21.0 | 2295 | 36.0 | 1645 | 51.0 | 1125 | 66.0 | 805 |
| 6.5 | 2805 | 21.5 | 2275 | 36.5 | 1625 | 51.5 | 1105 | 66.5 | 797 |
| 7.0 | 2785 | 22.0 | 2255 | 37.0 | 1605 | 52.0 | 1095 | 67.0 | 789 |
| 7.5 | 2765 | 22.5 | 2235 | 37.5 | 1585 | 52.5 | 1085 | 67.5 | 781 |
| 8.0 | 2745 | 23.0 | 2215 | 38.0 | 1565 | 53.0 | 1065 | 68.0 | 773 |
| 8.5 | 2730 | 23.5 | 2195 | 38.5 | 1545 | 53.5 | 1055 | 68.5 | 765 |
| 9.0 | 2715 | 24.0 | 2175 | 39.0 | 1525 | 54.0 | 1045 | 69.0 | 755 |
| 9.5 | 2685 | 24.5 | 2145 | 39.5 | 1495 | 54.5 | 1025 | 69.5 | 749 |
| 10.0 | 2670 | 25.0 | 2125 | 40.0 | 1480 | 55.0 | 1015 | 70.0 | 743 |
| 10.5 | 2655 | 25.5 | 2105 | 40.5 | 1465 | 55.5 | 1005 | | |
| 11.0 | 2645 | 26.0 | 2090 | 41.0 | 1445 | 56.0 | 1000 | | |
| 11.5 | 2625 | 26.5 | 2075 | 41.5 | 1435 | 56.5 | 995 | | |
| 12.0 | 2605 | 27.0 | 2035 | 42.0 | 1405 | 57.0 | 975 | | |
| 12.5 | 2595 | 27.5 | 2020 | 42.5 | 1395 | 57.5 | 965 | | |
| 13.0 | 2575 | 28.0 | 2005 | 43.0 | 1365 | 58.0 | 955 | | |
| 13.5 | 2555 | 28.5 | 1975 | 43.5 | 1355 | 58.5 | 945 | | |
| 14.0 | 2535 | 29.0 | 1953 | 44.0 | 1335 | 59.0 | 935 | | |
| 14.5 | 2520 | 29.5 | 1931 | 44.5 | 1320 | 59.5 | 925 | | |

FIG. 6B

| INPUT LEVEL | AGC VOLTAGE | INPUT LEVEL | AGC VOLTAGE | INPUT LEVEL | AGC VOLTAGE | INPUT LEVEL | AGC VOLTAGE | INPUT LEVEL | AGC VOLTAGE |
|---|---|---|---|---|---|---|---|---|---|
| -40.0 | 16 | -55.0 | 22 | -70.0 | 33 | -85.0 | 57 | -100.0 | 113 |
| -40.5 | 16 | -55.5 | 22 | -70.5 | 34 | -85.5 | 58 | -100.5 | 115 |
| -41.0 | 16 | -56.0 | 22 | -71.0 | 34 | -86.0 | 60 | -101.0 | 118 |
| -41.5 | 16 | -56.5 | 22 | -71.5 | 35 | -86.5 | 61 | -101.5 | 120 |
| -42.0 | 16 | -57.0 | 23 | -72.0 | 35 | -87.0 | 62 | -102.0 | 123 |
| -42.5 | 16 | -57.5 | 23 | -72.5 | 36 | -87.5 | 64 | -102.5 | 124 |
| -43.0 | 16 | -58.0 | 23 | -73.0 | 37 | -88.0 | 65 | -103.0 | 128 |
| -43.5 | 16 | -58.5 | 24 | -73.5 | 37 | -88.5 | 66 | -103.5 | 129 |
| -44.0 | 17 | -59.0 | 24 | -74.0 | 38 | -89.0 | 68 | -104.0 | 133 |
| -44.5 | 17 | -59.5 | 24 | -74.5 | 38 | -89.5 | 69 | -104.5 | 134 |
| -45.0 | 17 | -60.0 | 25 | -75.0 | 39 | -90.0 | 71 | -105.0 | 136 |
| -45.5 | 17 | -60.5 | 25 | -75.5 | 40 | -90.5 | 72 | -105.5 | 137 |
| -46.0 | 17 | -61.0 | 25 | -76.0 | 40 | -91.0 | 74 | -106.0 | 140 |
| -46.5 | 18 | -61.5 | 26 | -76.5 | 41 | -91.5 | 76 | -106.5 | 141 |
| -47.0 | 18 | -62.0 | 26 | -77.0 | 42 | -92.0 | 78 | -107.0 | 143 |
| -47.5 | 18 | -62.5 | 26 | -77.5 | 43 | -92.5 | 80 | -107.5 | 144 |
| -48.0 | 18 | -63.0 | 27 | -78.0 | 44 | -93.0 | 82 | -108.0 | 146 |
| -48.5 | 18 | -63.5 | 27 | -78.5 | 44 | -93.5 | 84 | -108.5 | 149 |
| -49.0 | 19 | -64.0 | 28 | -79.0 | 45 | -94.0 | 86 | -109.0 | 151 |
| -49.5 | 19 | -64.5 | 28 | -79.5 | 46 | -94.5 | 88 | -109.5 | 151 |
| -50.0 | 19 | -65.0 | 28 | -80.0 | 47 | -95.0 | 90 | -110.0 | 151 |
| -50.5 | 19 | -65.5 | 29 | -80.5 | 48 | -95.5 | 92 | -110.5 | 153 |
| -51.0 | 20 | -66.0 | 29 | -81.0 | 49 | -96.0 | 95 | -111.0 | 154 |
| -51.5 | 20 | -66.5 | 30 | -81.5 | 50 | -96.5 | 97 | -111.5 | 155 |
| -52.0 | 20 | -67.0 | 30 | -82.0 | 51 | -97.0 | 98 | -112.0 | 156 |
| -52.5 | 20 | -67.5 | 31 | -82.5 | 52 | -97.5 | 100 | -112.5 | 157 |
| -53.0 | 21 | -68.0 | 32 | -83.0 | 53 | -98.0 | 104 | -113.0 | 158 |
| -53.3 | 21 | -68.5 | 32 | -83.5 | 54 | -98.5 | 106 | | |
| -54.0 | 21 | -69.0 | 32 | -84.0 | 55 | -99.0 | 109 | | |
| -54.5 | 21 | -69.5 | 33 | -84.5 | 56 | -99.5 | 110 | | |

FIG. 7A

Sheet 2

| AGC Voltage | Input Level | AGC Voltage | Input Level | AGC Voltage | Input Level | AGC Voltage | Input Level | AGC Voltage | Input Level | AGC Voltage | Input Level |
|---|---|---|---|---|---|---|---|---|---|---|---|
| 16 | -41.8 | 41 | -76.5 | 66 | -88.5 | 91 | -95.3 | 116 | -100.6 | 141 | -106.5 |
| 17 | -45.0 | 42 | -77.0 | 67 | -88.8 | 92 | -95.5 | 117 | -100.8 | 142 | -106.8 |
| 18 | -47.5 | 43 | -77.5 | 68 | -89.0 | 93 | -95.6 | 118 | -101.0 | 143 | -107.0 |
| 19 | -49.8 | 44 | -78.8 | 69 | -89.5 | 94 | -95.8 | 119 | -101.3 | 144 | -107.5 |
| 20 | -51.8 | 45 | -79.0 | 70 | -89.8 | 95 | -96.0 | 120 | -101.5 | 145 | -107.8 |
| 21 | -53.8 | 46 | -79.5 | 71 | -90.0 | 96 | -96.3 | 121 | -101.6 | 146 | -108.0 |
| 22 | -55.8 | 47 | -80.0 | 72 | -90.5 | 97 | -96.5 | 122 | -101.8 | 147 | -108.1 |
| 23 | -57.5 | 48 | -80.5 | 73 | -90.8 | 98 | -97.0 | 123 | -102.0 | 148 | -108.3 |
| 24 | -59.0 | 49 | -81.0 | 74 | -91.0 | 99 | -97.3 | 124 | -102.5 | 149 | -109.5 |
| 25 | -60.5 | 50 | -81.5 | 75 | -91.3 | 100 | -97.5 | 125 | -102.6 | 150 | -108.8 |
| 26 | -62.0 | 51 | -82.0 | 76 | -91.5 | 101 | -97.6 | 126 | -102.7 | 151 | -109.5 |
| 27 | -63.3 | 52 | -82.5 | 77 | -91.8 | 102 | -97.7 | 127 | -102.8 | 152 | -110.3 |
| 28 | -64.5 | 53 | -83.0 | 78 | -92.0 | 103 | -97.8 | 128 | -103.0 | 153 | -110.5 |
| 29 | -65.8 | 54 | -83.5 | 79 | -92.3 | 104 | -98.0 | 129 | -103.5 | 154 | -111.0 |
| 30 | -66.8 | 55 | -84.0 | 80 | -92.5 | 105 | -98.3 | 130 | -103.6 | 155 | -111.5 |
| 31 | -67.5 | 56 | -84.5 | 81 | -92.8 | 106 | -98.5 | 131 | -103.7 | 156 | -112.0 |
| 32 | -68.5 | 57 | -85.0 | 82 | -93.0 | 107 | -98.6 | 132 | -103.8 | 157 | -112.5 |
| 33 | -69.8 | 58 | -85.5 | 83 | -93.3 | 108 | -98.8 | 133 | -104.0 | 158 | -113.0 |
| 34 | -70.8 | 59 | -85.8 | 84 | -93.5 | 109 | -99.0 | 134 | -104.5 | | |
| 35 | -71.8 | 60 | -86.0 | 85 | -93.8 | 110 | -99.5 | 135 | -104.8 | | |
| 36 | -72.5 | 61 | -86.5 | 86 | -94.0 | 111 | -99.6 | 136 | -105.0 | | |
| 37 | -73.3 | 62 | -87.0 | 87 | -94.3 | 112 | -99.8 | 137 | -105.5 | | |
| 38 | -74.3 | 63 | -87.3 | 88 | -94.5 | 113 | -100.0 | 138 | -105.6 | | |
| 39 | -75.0 | 64 | -87.5 | 89 | -94.8 | 114 | -100.3 | 139 | -105.8 | | |
| 40 | -75.8 | 65 | -88.0 | 90 | -95.0 | 115 | -100.5 | 140 | -106.0 | | |

FIG 7B

APPARATUS AND METHODS FOR TRACKING POWER LEVEL OF RECEIVED SIGNAL IN CODE DIVISION MULTIPLE ACCESS COMMUNICATION SYSTEM

BACKGROUND OF THE INVENTION

1. Field of the Invention

The present invention relates to a base station of a code division multiple access (CDMA) digital cellular communication system and, in particular, to apparatus and methods for tracking a power level of a received signal.

2. Description of the Related Art

Generally, in an analog cellular communication system, transmitting power sent from a mobile telephone subscriber is controlled by measuring a power level of a signal received at the base station of such system. If the power level of the signal received at the base station from a mobile telephone is less than a reference value, the system will increase the transmitting power of the mobile telephone. On the other hand, if such power level is greater than the reference value, the system will decrease the transmitting power of the mobile telephone. In a conventional analog cellular communication system, the power level of the signal received at the base station is measured by using a level of a received signal strength indicator (RSSI).

Similar to the analog cellular communication system, a CDMA communication system (which is a recent digital cellular communication system) requires an operation for controlling the transmitting and receiving powers in order to maintain a maximum traffic capacity. The CDMA communication system differs from the conventional analog cellular communication system, however, in that the base station of the CDMA communication system includes a variable attenuator within a receiving frequency conversion board of a transceiver unit in a backward link in order to accurately control the transmitting and receiving powers. Specifically, an RSSI value of the received signal varies according to a control voltage of such variable attenuator. Therefore, if the control operation used in the base station of the conventional analog cellular system is utilized in the CDMA communication system, it is difficult to accurately track the power level of the received signal (which is a representative parameter in the operation for controlling the transmitting and receiving powers) without using an additional algorithm to consider an attenuation of the variable attenuator.

SUMMARY OF THE INVENTION

Accordingly, it is an object of the present invention to provide apparatus and methods for tracking the power level of a signal received at a base station of a CDMA communication system considering the attenuation of the variable attenuator by using an RSSI value of a signal received through an antenna of such base station.

In one aspect of the present invention, an apparatus for tracking a power level of a signal received at a base station of a CDMA digital cellular communication system includes: means for storing a first lookup table comprising a series of automatic gain control voltages corresponding to a series of received signal levels and a second lookup table comprising a series of variable attenuation control voltages corresponding to said automatic gain control voltages; and processing means for determining a power level of said received signal at said base station, whereby said processing means tracks said received signal by extracting a signal level of a current state by the automatic gain control voltage and variable attenuation control voltage of the received signal and extracting a signal level corresponding to the automatic gain control voltage of the received signal.

In another aspect of the present invention, a method for tracking a power level of a signal received at a base station of a CDMA digital cellular communication system includes the steps of: collecting an automatic gain control voltage and a variable attenuation control voltage of a currently received signal; tracking an input level of the received signal corresponding to the automatic gain control voltage of the received signal; tracking the automatic gain control voltage corresponding to the variable attenuation control voltage of the received signal; calculating a difference between input levels by using the tracked automatic gain control voltage; and calculating the power level of the received signal by subtracting the difference between input levels from the tracked input level.

In still a further aspect of the present invention, a method for tracking a power level of a signal received at a base station of a CDMA digital cellular communication system includes the steps of: collecting an automatic gain control voltage and a variable attenuation control voltage of a currently received signal; tracking an input level of the received signal corresponding to the automatic gain control voltage of the received signal; tracking an attenuation corresponding to the variable attenuation control voltage of the received signal; and calculating the power level of the received signal by subtracting the tracked attenuation from the tracked input level.

These and other objects, features and advantages of the present invention will become more apparent from the following detailed description when read with the accompanying drawings in which like reference numerals or symbols designate like elements.

BRIEF DESCRIPTION OF THE DRAWINGS

FIGS. 6a and 6b are characteristic lookup tables of a variable attenuator which are stored in the EEPROM as shown in FIG. 3; and FIGS. 7a and 7b are RSSI characteristic lookup tables which are stored in the EEPROM as shown in FIG. 3.

DETAILED DESCRIPTION OF PREFERRED EMBODIMENTS

It is to be understood in the following description of preferred embodiments that well known functions and constructions which may obscure the present invention in unnecessary detail are not described in detail.

Figure 1:
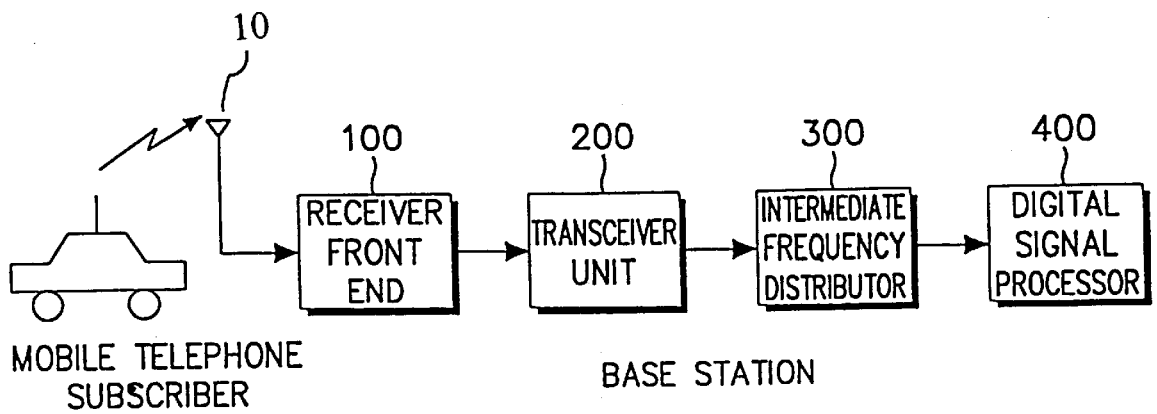
FIG. 1 is a block diagram showing the construction of a backward link of a CDMA communication system according to an embodiment of the present invention.

Referring to FIG. 1, a block diagram is shown of the construction of a backward link of a CDMA communication system according to an embodiment of the present invention. In the CDMA communication system which tracks the power level of the received signal, the backward link is the path through which the base station receives a radio frequency signal transmitted from the mobile telephone subscriber. The base station includes a receiver front end 100, a transceiver unit 200 operatively connected to the receiver front end 100, an intermediate frequency distributor 300 operatively connected to the transceiver unit 200, and a digital signal processor 400 operatively connected to the intermediate frequency distributor 300.

Figure 2:
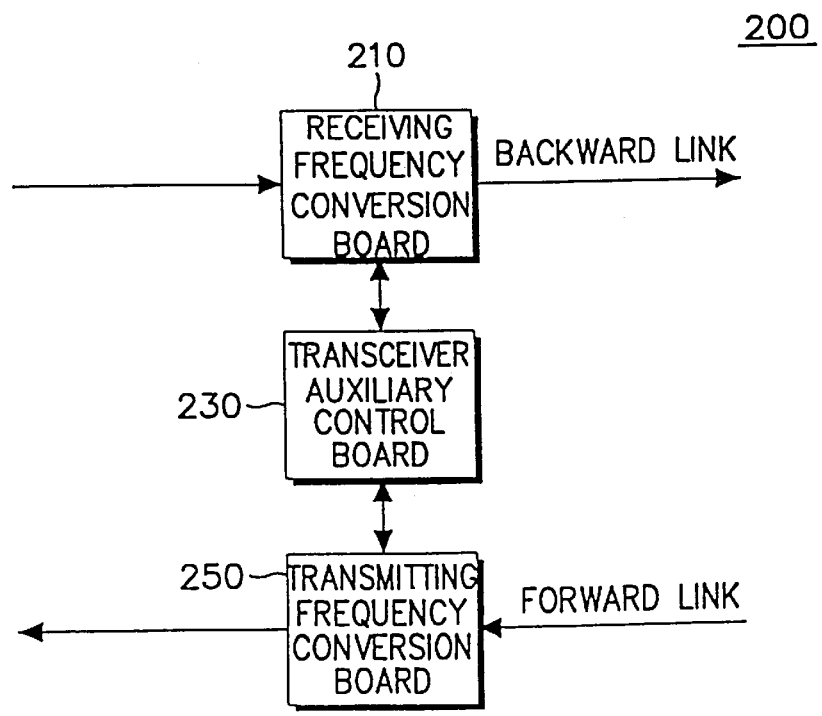
FIG. 2 is a block diagram of the transceiver unit as shown in FIG. 1 according to the present invention.

Referring to FIG. 2, the construction of the transceiver unit 200 of FIG. 1 is shown. The transceiver unit 200 comprises a receiving frequency conversion board 210 operatively coupled to a transceiver auxiliary control board 230, and a transmitting frequency conversion board 250 operatively coupled to the transceiver auxiliary control board 230. The receiving frequency conversion board 210 constitutes the backward link of the CDMA communication system. The transmitting frequency conversion board 250 constitutes a forward link of the CDMA communication system. The transceiver auxiliary control board 230, operatively connected between the receiving frequency conversion board 210 and the transmitting frequency conversion board 250, controls the receiving power.

In order to maintain a proper cell region and a maximum traffic capacity, the CDMA communication system should control the receiving power of the forward and backward links. To control the receiving power of the backward link, the power level of a signal received through an antenna 10 (FIG. 1) should be accurately measured. In the CDMA communication system according to the present invention, the receiving power of the backward link can be controlled according to state variations of the base station (i.e., a variation in traffic within the base station or a change in a base station service area) by accurately tracking the power level of the received signal. The receiving power in the backward link of the base station is controlled by a variation in the level of attenuation of a variable attenuator 214 (FIG. 3), which is controlled by the transceiver auxiliary control board 230.

Figure 3:
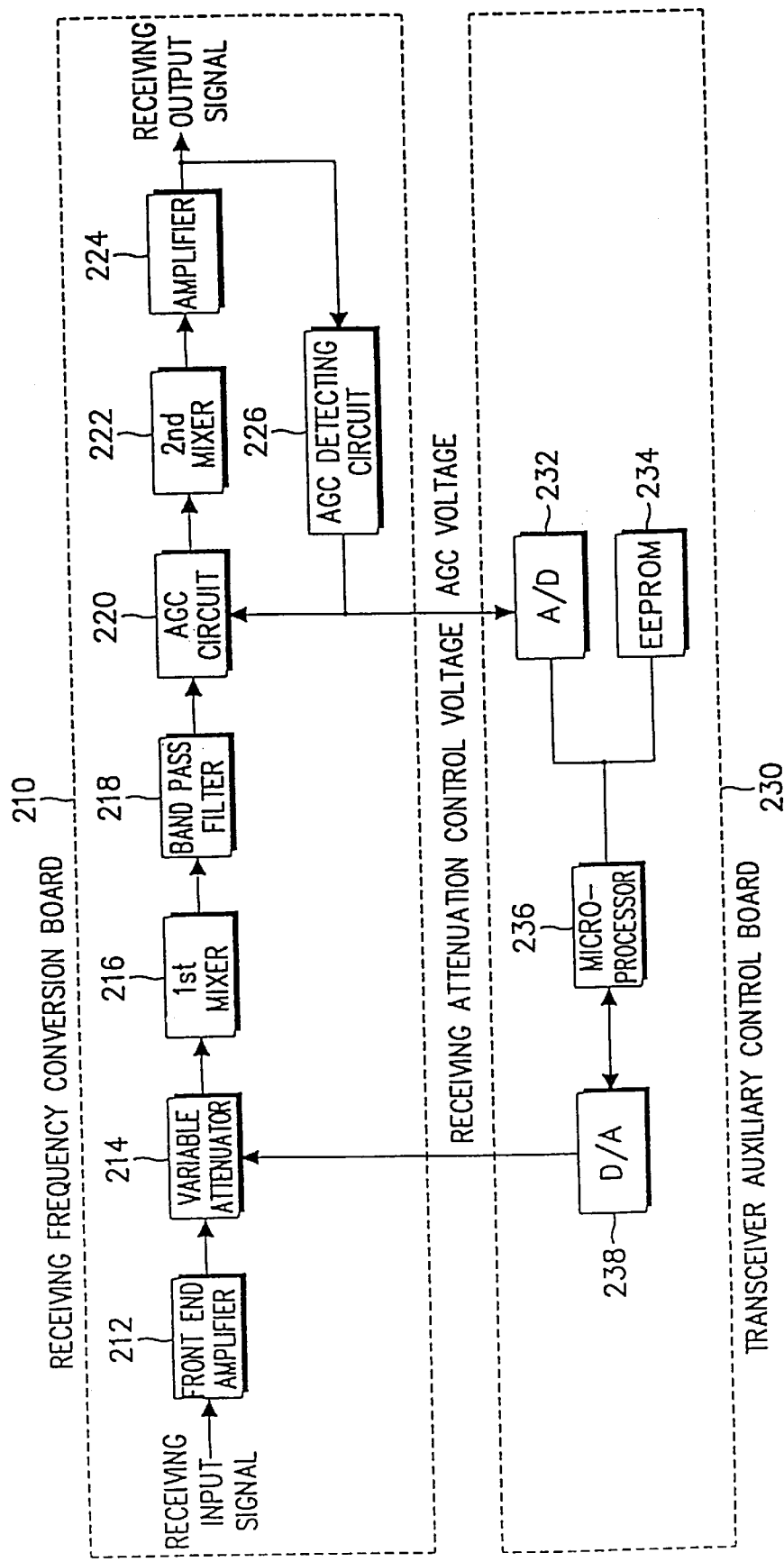
FIG. 3 is a block diagram of the receiving frequency conversion board and the transceiver auxiliary control board as shown in FIG. 2 according to the present invention.

Referring to FIG. 3, a block diagram of the receiving frequency conversion board 210 and the transceiver auxiliary control board 230 according to the present invention are shown. The receiving frequency conversion board 210 includes a front end amplifier 212 for receiving an input signal, a variable attenuator 214, operatively connected to the front end amplifier 212, a first mixer 216, operatively connected to the variable attenuator 214, a band pass filter 218, operatively connected to the first mixer 216, an automatic gain control (AGC) circuit 220, operatively connected to the band pass filter 218, a second mixer 222, operatively connected to the AGC circuit 220, an amplifier 224, operatively connected to the second mixer 222, and an AGC detecting circuit 226, operatively connected to the amplifier 224.

The transceiver auxiliary control board 230 comprises an analog-to-digital (A/D) converter 232, operatively connected to the AGC detecting circuit 226 of the receiving frequency conversion board 210, an EEPROM (Electrically Erasable and Programmable Read Only Memory) 234, a microprocessor 236, the microprocessor 236 being operatively connected to the A/D converter 232 and the EEPROM 234, and a digital-to-analog (D/A) converter 238, operatively connected to the microprocessor 236 and the variable attenuator 214 of the receiving frequency conversion board 210.

In order to accurately track the power level of the received signal, the present invention utilizes an RSSI value of a currently received signal, which varies according to a level of a signal received through the antenna 10 of the base station (FIG. 1), a variable attenuation control voltage which is obtained from the transceiver auxiliary control board 230 for controlling the variable attenuator 214, and a characteristic lookup table of the variable attenuator 214 and an RSSI characteristic lookup table of the backward link (i.e., the receiving frequency conversion board 210), both of which are stored in the EEPROM 234 of the transceiver auxiliary control board 230.

Figure 6A:
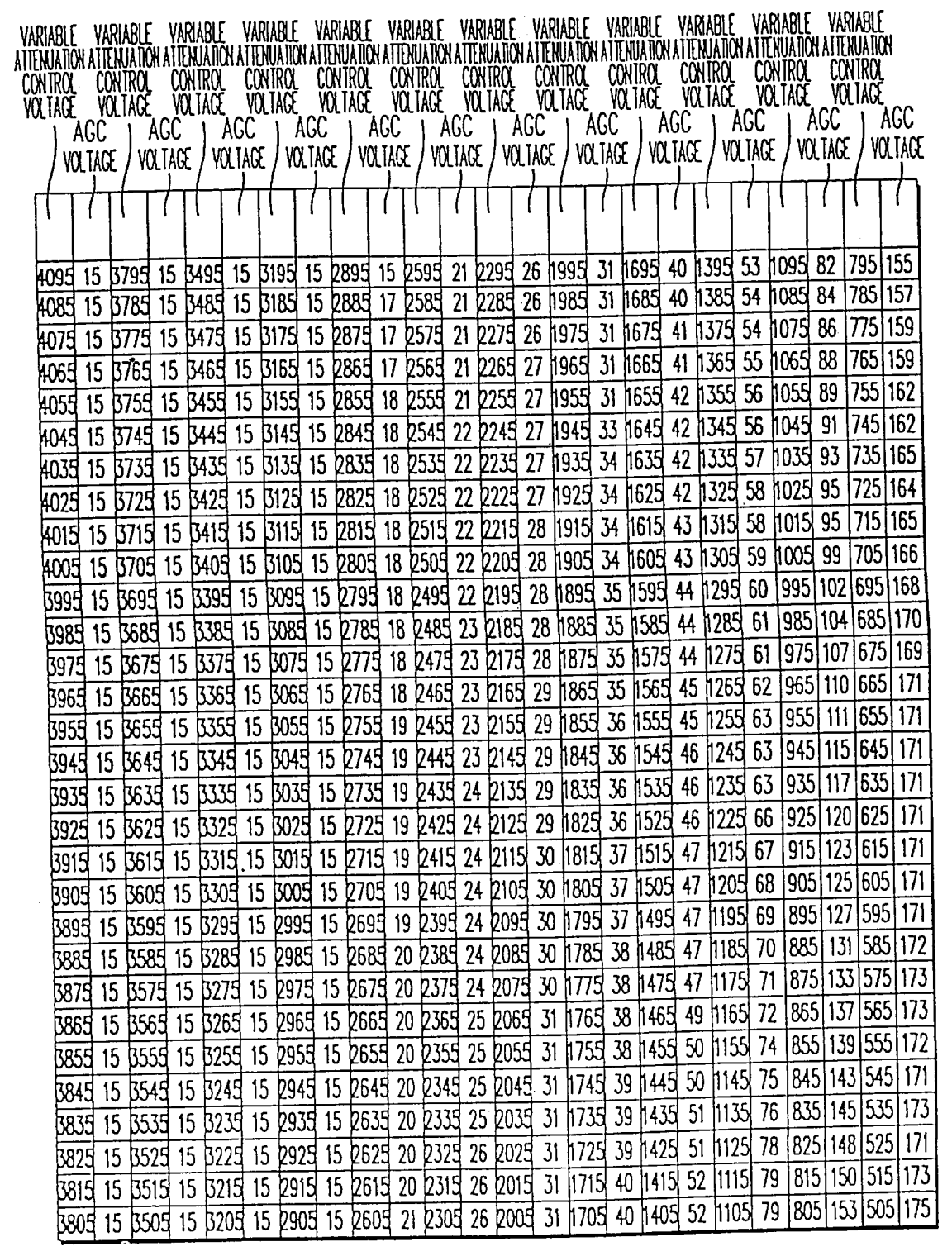

Referring to FIGS. 6a and 6b, characteristic lookup tables for the variable attenuator 214 are shown. Specifically, FIG. 6a is a table showing the varying attenuation control voltages which are generated by the transceiver auxiliary control board 230 in response to the corresponding AGC voltages which are detected by the AGC detecting circuit 226. Further, FIG. 6b is a table showing the degree of attenuation of the variable attenuator 214 in response to the corresponding variable attenuation control voltages which are generated by the transceiver auxiliary control board 230.

Referring to FIGS. 7a and 7b, the RSSI characteristic lookup tables indicating the power level (in dBm) of the received signal are shown. Specifically, FIG. 7a is a table showing the AGC voltages (which are detected by the AGC detecting circuit 226) in response to corresponding input levels (in dBm) of the received signal. Further, FIG. 7b is a table showing input levels (in dBm) of the received signal which correspond to the AGC voltages which are detected by the AGC detecting circuit 226.

It is to be understood that the values set forth in FIGS. 6a, 6b, 7a and 7b for the AGC voltage and the Variable Attenuation Control Voltage represent the different steps (i.e., resolution) outputted from the A/D converter 232 (which has a length of 8 bits thereby providing 256 digital output values for the AGC) and the different steps inputted to the D/A converter 238 (which has a length of 12 bits thereby providing 4096 possible input values for the Attenuation control voltage). It is to be further understood that the Input Levels in FIG. 7b denote the average Input Levels of the corresponding AGC Voltage from FIG. 7a. For example, in FIG. 7a, a plurality of Input levels (ranging from −40.0 to −43.5) correspond to AGC Voltage 16. Therefore, in FIG. 7b, the Input level of −41.8 denotes the average Input Level for the above plurality of Input Levels for AGC Voltage 16.

Figure 4:
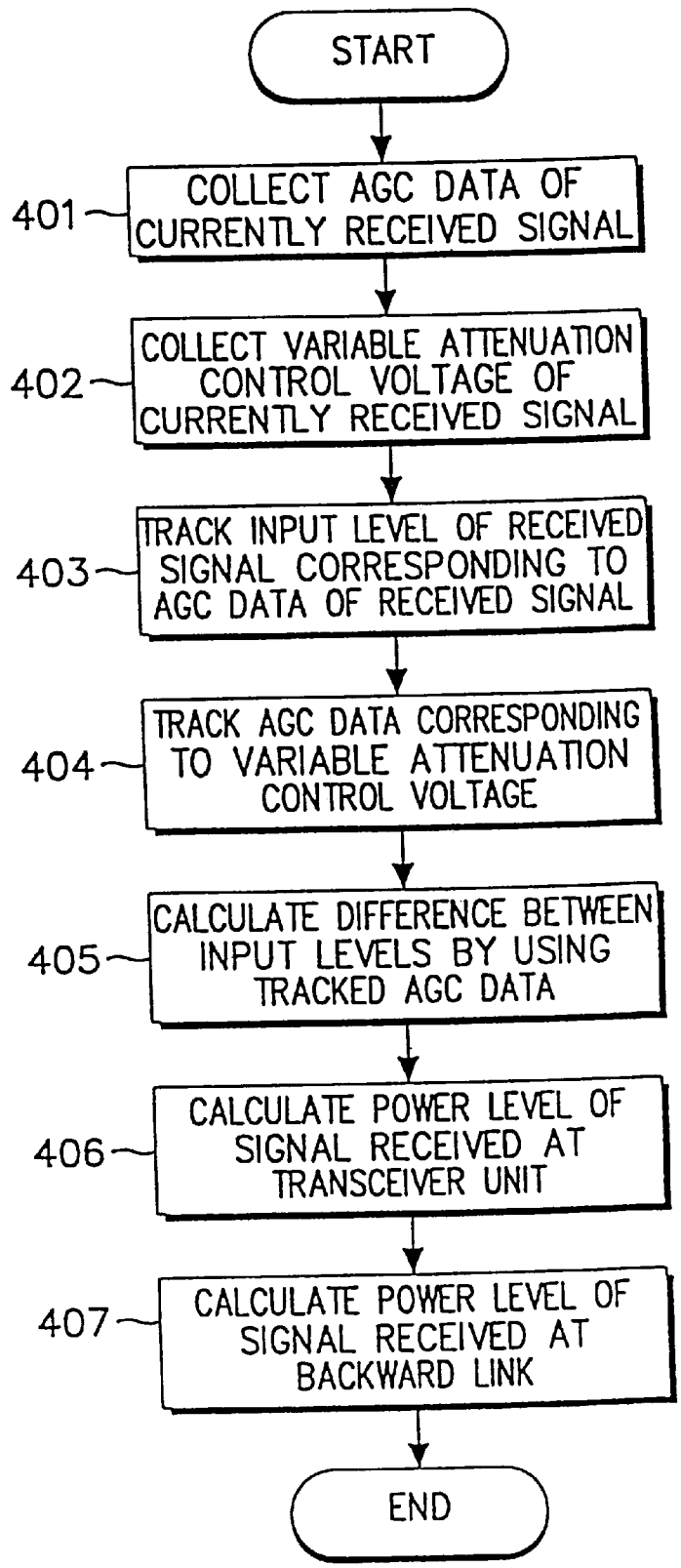
FIG. 4 is a flow chart showing a control process for tracking a power level of a received signal according to one aspect of the present invention.
Figure 5:
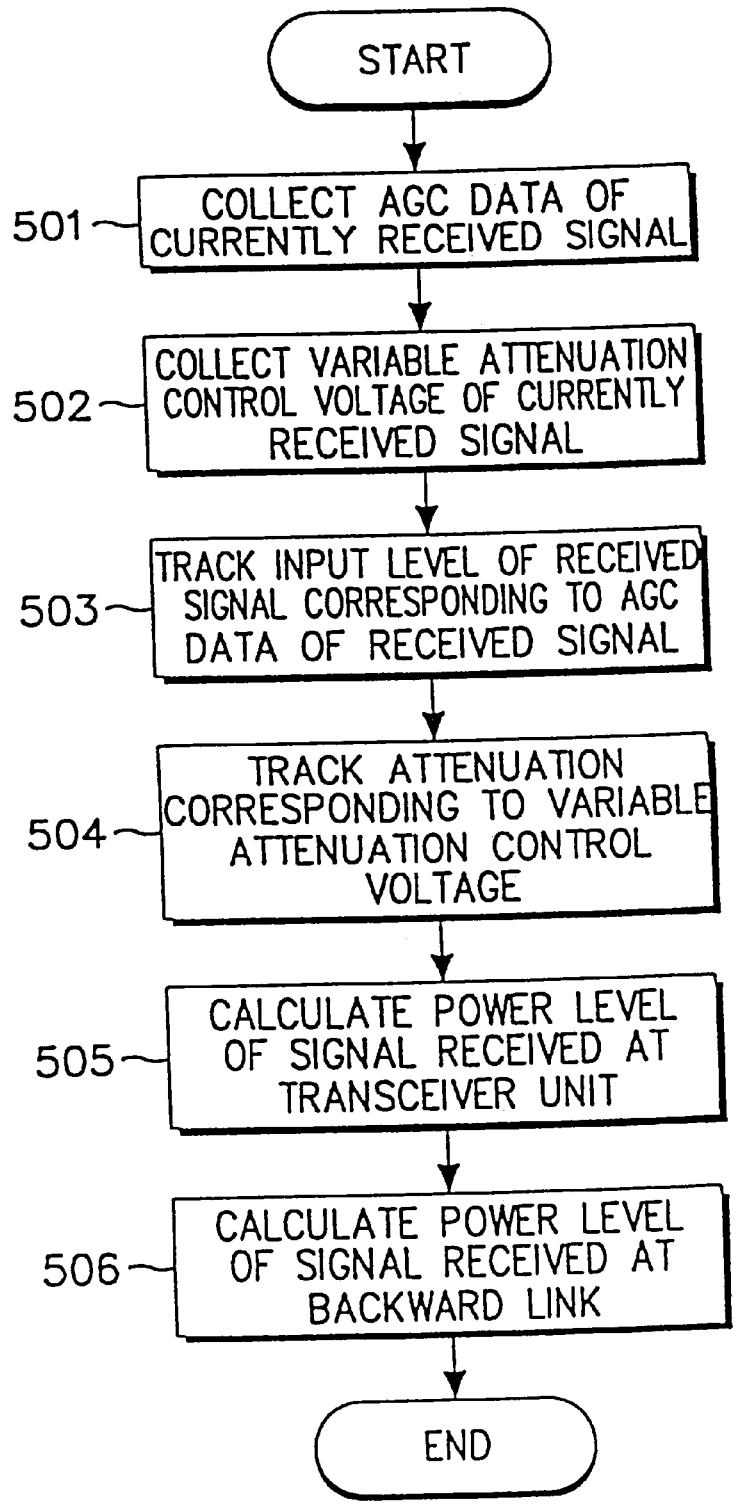
FIG. 5 is a flow chart showing a control process for tracking a power level of a received signal according to another aspect of the present invention.

The characteristic lookup tables of FIGS. 6a, 6b, 7a and 7b are stored in the EEPROM 234 of the transceiver auxiliary control board 230. The microprocessor 236 tracks the power level of the received signal by using such tables. The power level tracking operation is illustrated in FIGS. 4 and 5. The base station controls the power level of the received signal according to the control processes shown in FIGS. 4 and 5.

Referring to FIG. 4, a flow chart showing a control process for tracking a power level of a received signal according to one aspect of the present invention is shown. The microprocessor 236 collects AGC data of a currently received signal from the AGC detecting circuit 226 of the receiving frequency control board 210 (step w 401). Specifically, the microprocessor 236 collects the output value of the A/D converter 232 corresponding to the voltage detected by the AGC detecting circuit 226. The microprocessor 236 then collects the variable attenuation control voltage corresponding to the AGC data of the currently received signal from the characteristic lookup table of FIG.

6a which is stored in the EEPROM 234 (step 402). The microprocessor 236 then tracks the input level of the received signal corresponding to the AGC data of the received signal from the RSSI characteristic lookup table shown in FIG. 7a or 7b (step 403). The microprocessor 236 then tracks the AGC data corresponding to the variable attenuation control voltage from the characteristic lookup table shown in FIG. 6a (step 404). The microprocessor 236 then calculates a difference between the input levels from the RSSI characteristic lookup table shown in FIG. 7a or 7b by using the AGC data tracked at step 404 (step 405). The microprocessor 236 then calculates the power level of a signal received at the transceiver unit 200 by subtracting the difference calculated in step 405 from the input level of the received signal tracked in step 403 (step 406). Next, the microprocessor 236 calculates the power level of the signal received at the backward link by subtracting a gain of a front end of the base station from the power level calculated in step 406 (step 407).

Referring to FIG. 5, a flow chart showing a control process for tracking a power level of a received signal according to another aspect of the present invention is shown. The microprocessor 236 collects AGC data of a currently received signal from the AGC detecting circuit 226 of the receiving frequency control board 210 (step 501). The microprocessor 236 then collects the variable attenuation control voltage corresponding to the AGC data of the currently received signal from the characteristic lookup table of FIG. 6a which is stored in the EEPROM 234 (step 502). Next, the microprocessor 236 tracks the input level of the received signal corresponding to the AGC data of the received signal from the RSSI characteristic lookup table shown in FIG. 7a or 7b (step 503). The microprocessor 236 then tracks the attenuation corresponding to the variable attenuation control voltage from the characteristic lookup table shown in FIG. 6b (step 504). Next, the microprocessor 236 calculates the power level of a signal received at the transceiver unit 200 by subtracting attenuation tracked in step 504 from the input level of the received signal tracked in step 503 (step 505). The microprocessor 236 then calculates the power level of a signal received at the backward link by subtracting the front end gain of the base station from the power level calculated in step 503 (step 506).

As demonstrated above, the power level of the received signal can be accurately tracked irrespective of a variation in the attenuation of the variable attenuator and a variation in the RSSI value. Accordingly, the operation for controlling the receiving power, which is required to maintain a maximum traffic capacity in the CDMA communication system, can be accurately performed.

Although illustrative embodiments of the present invention have been described herein with reference to the accompanying drawings, it is to be understood that the invention is not limited to those precise embodiments, and that various other changes and modifications may be effected therein by one skilled in the art without departing from the true scope and spirit of the present invention as defined by the appended claims.

What is claimed is:

1. An apparatus for tracking a power level of a signal received at a base station of a code division multiple access (CDMA) digital cellular communication system, comprising:

means for storing a first lookup table comprising a series of automatic gain control voltages corresponding to a series of received signal levels and a second lookup table comprising a series of variable attenuation control voltages corresponding to said automatic gain control voltages; and processing means for determining a power level of said received signal at said base station, whereby said processing means tracks said received signal by extracting a signal level of a current state by the automatic gain control voltage and variable attenuation control voltage of the received signal and extracting a signal level corresponding to the automatic gain control voltage of the received signal.

2. A method for tracking a power level of a signal received at a base station of a code division multiple access (CDMA) digital cellular communication system having a storage unit for storing a first table comprising automatic gain control voltages corresponding to a series of received signal levels and having a second table comprising variable attenuation control voltages corresponding to said automatic gain control voltages, said method comprising the steps of:

collecting an automatic gain control voltage and a variable attenuation control voltage of a currently received signal;

tracking an input level of the received signal corresponding to the automatic gain control voltage of the received signal from said first table;

tracking the automatic gain control voltage corresponding to the variable attenuation control voltage of the received signal from said second table;

calculating a difference between input levels from said first table by using the tracked automatic gain control voltage; and calculating the power level of the received signal by subtracting said difference between input levels from the tracked input level.

3. A method for tracking a power level of a signal received at a base station of a code division multiple access (CDMA) digital cellular communication system having a storage unit for storing a first table comprising automatic gain control voltages corresponding to a series of received signal levels and a second table for storing variable attenuation control voltages corresponding to said automatic gain control voltages, said method comprising the steps of:

collecting an automatic gain control voltage and a variable attenuation control voltage of a currently received signal;

tracking an input level of the received signal corresponding to the automatic gain control voltage of the received signal from said first table;

tracking an attenuation corresponding to the variable attenuation control voltage of the received signal from said second table; and calculating the power level of the received signal by subtracting the tracked attenuation from the tracked input level.

* * * * *